United States Patent
Cygan

[19]

[11] Patent Number: 6,085,074
[45] Date of Patent: *Jul. 4, 2000

[54] APPARATUS AND METHOD FOR AMPLIFYING AN AMPLITUDE-VARYING SIGNAL

[75] Inventor: Lawrence F. Cygan, Schaumburg, Ill.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/807,407

[22] Filed: Feb. 28, 1997

[51] Int. Cl.[7] .................................................. H04B 1/06
[52] U.S. Cl. ...................... 455/241.1; 455/251; 455/333; 455/303; 330/295; 333/100
[58] Field of Search .............................. 455/241.1, 251.1, 455/353.2, 303, 311, 341, 333; 330/124.12, 295; 333/100

[56] References Cited

U.S. PATENT DOCUMENTS

| | | | |
|---|---|---|---|
| 5,548,246 | 8/1996 | Yamamoto et al. | 330/15 |
| 5,684,430 | 11/1997 | Yamamoto | 330/124 |
| 5,757,229 | 5/1998 | Mitzlaff | 330/124 |

*Primary Examiner*—Daniel S. Hunter
*Assistant Examiner*—Darnell R. Armstrong
*Attorney, Agent, or Firm*—Daniel C. Crilly; Jeffrey K. Jacobs

[57] ABSTRACT

An amplifier (300) comprising two amplifier stages (301, 303), a signal splitter (305), and a signal combiner (307) amplifies an amplitude-varying input signal (128) in the following manner. The signal splitter (305) receives a signal of varying amplitude (128) and splits the received signal into a first amplitude-varying signal (325) and a second amplitude-varying signal (327). The first amplifier stage (301) applies a first gain to the first amplitude-varying signal (325). The second amplifier stage (303) applies a second gain that is greater than the first gain to the second amplitude-varying signal (327) only when an amplitude of the second amplitude-varying signal (327) exceeds a threshold. The signal combiner (307) combines the amplified signals outputted from the amplifier stages (301, 303) to produce the amplifier output signal.

26 Claims, 4 Drawing Sheets

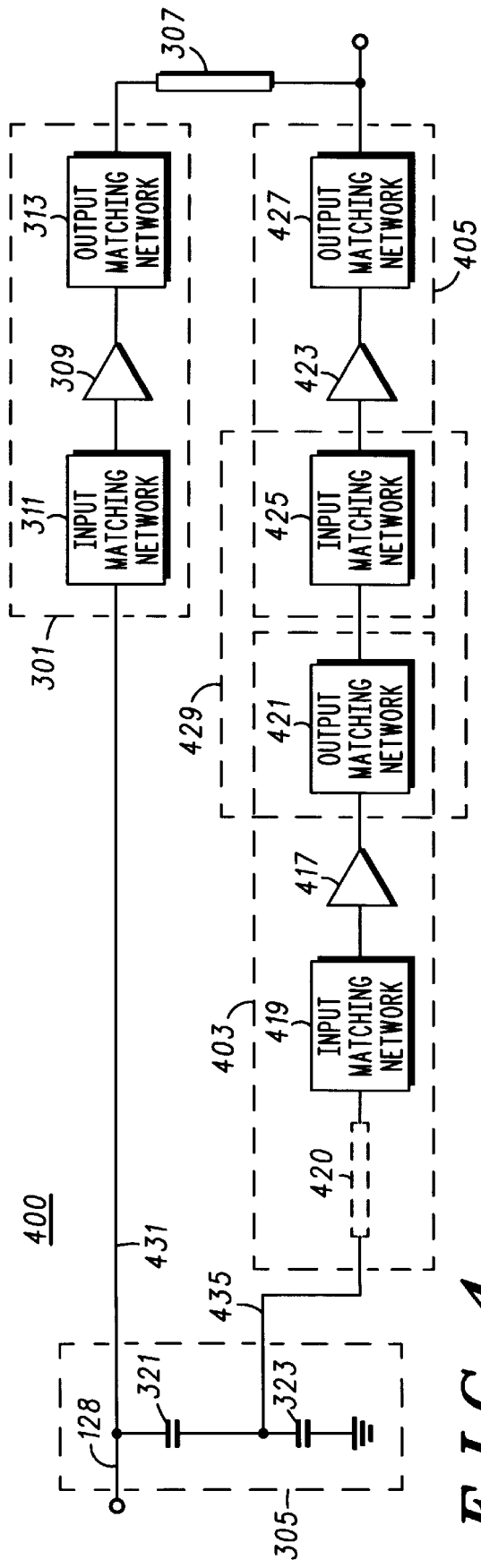
*F I G . 4*
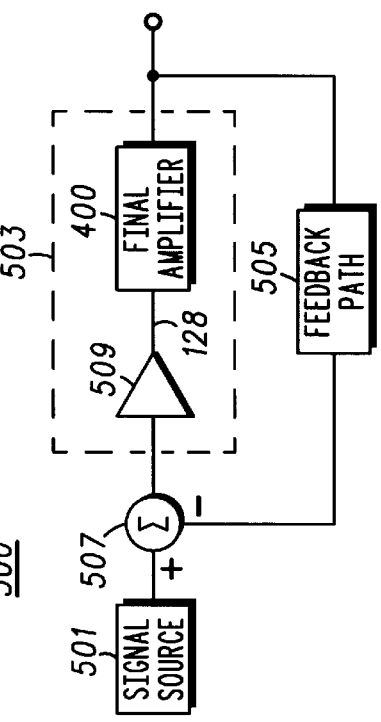
*F I G . 5*

APPARATUS AND METHOD FOR AMPLIFYING AN AMPLITUDE-VARYING SIGNAL

FIELD OF THE INVENTION

The present invention relates generally to amplifiers and, in particular, to amplifiers that amplify amplitude-varying signals.

BACKGROUND OF THE INVENTION

Amplifiers are known to be either linear or nonlinear. Linear amplifiers are often used to amplify amplitude varying signals, such as amplitude modulated (AM) signals. Nonlinear amplifiers are often used to amplify constant amplitude signals, such as frequency modulated (FM) signals.

One known type of linear amplifier is the Doherty-type amplifier. The Doherty-type amplifier was originally developed to improve the efficiency of high power vacuum tube transmitters broadcasting in the AM frequency band. The Doherty concept was initially extended to radio frequencies, and with the advent of gallium arsenide transistors, has now been extended to microwave frequencies. The extension of Doherty-type amplifiers to radio frequencies is generally described in a publication entitled "Efficiency of Doherty RF Power-Amplifier Systems," authored by F. H. Raab, and published in the Institute of Electrical and Electronics Engineers (IEEE) Transactions on Broadcasting, Volume BC-33, Number 3, September 1987, at pages 77–83. One example of the extension of Doherty-type amplifiers to microwave frequencies is provided in U.S. Pat. No. 5,420,541 issued to Upton et al. Both of these references are incorporated herein by reference.

A block diagram of a typical RF Doherty-type amplifier 100 is shown in FIG. 1. The Doherty-type amplifier includes a carrier amplifier stage 101, a peaking amplifier stage 103, a signal splitter 105, a signal combiner 107, and a phase-matching transmission line 109. The carrier amplifier stage 101 typically includes a class AB carrier amplifier 111 and associated input and output matching circuits 113, 115. The peaking amplifier stage 103 typically includes a class C peaking amplifier 117 and associated input and output matching circuits 119, 121. The signal splitter 105 typically comprises a three decibel (dB) splitter that includes two 70.7 ohm, one-quarter wavelength transmission lines 123, 124 and a 100 ohm isolation resistor 126. The signal combiner 107 typically comprises a one-quarter wavelength transmission line transformer having a nominal characteristic impedance of 70.7 ohms. The phase-matching transmission line 109 comprises a one-quarter wavelength transmission line having a nominal characteristic impedance of 50 ohms and is used to offset the one-quarter wavelength phase shift introduced by the signal combiner 107.

When an amplitude-varying input signal 128, such as the exemplary AM signal depicted in FIG. 2, is applied to the amplifier input, the signal splitter 105 divides the input signal power equally between the carrier amplifier stage 101 and the peaking amplifier stage 103. The signal splitter 105 also isolates the amplifier stages 101, 103 from one another via its isolation resistor 126. When the amplitude of the input signal 128 is at or below the envelope average 201 ($P_{AVG}$ in FIG. 2), the peaking amplifier stage 103 remains in an "off state" resulting from its class C bias operation. In the off state, the peaking amplifier stage 103 presents a high impedance to the junction 129 of the 50 ohm load 130 (e.g., an antenna) and the signal combiner 107, thereby presenting minimal loading to the carrier amplifier stage 101. In addition, when the peaking amplifier stage 103 is the "off state," the 50 ohm load 130 presents an effective load of 100 ohms to the carrier amplifier stage 101 due to the impedance transformation properties of the signal combiner 107. The output matching network 115 of the carrier amplifier stage 101 is typically optimized to operate the class AB carrier amplifier 111 near saturation when the input signal level is at the envelope average 201 and the output matching network 115 is loaded with 100 ohms. Since high efficiency occurs near saturation, the carrier amplifier stage 101 alone operates very efficiently when the input signal amplitude 128 is at the envelope average 201.

As the input signal level rises above the envelope average 201 toward a desired peak envelope power (PEP) level 203, the peaking amplifier 117 is driven out of cutoff and the peaking amplifier stage 103 begins sourcing current into the combining junction 129. As the operation of the peaking amplifier 117 moves from cutoff to saturation, the effective impedance perceived by the carrier amplifier stage 101 decreases from 100 ohms (when the peaking amplifier 117 is cutoff) to a value of 50 ohms (at PEP drive when the peaking amplifier 117 is operating in saturation). This two-fold reduction of load impedance allows the carrier amplifier stage 101 to source twice its former power level, while remaining near saturation and operating efficiently. Thus, at PEP drive, the carrier amplifier stage 101 provides one-half of the amplifier's desired PEP output power. The peaking amplifier stage 103 is designed to produce the remaining one-half of the amplifier's PEP output power requirement. In practical application, the carrier amplifier 111 and the peaking amplifier 117 are often the same active device (e.g., radio frequency (RF) power transistor). However, because of their different classes of operation, they are operated at different biases. The operation at different biases often results in the two amplifiers 111, 117 providing unequal gains, with the gain of the carrier amplifier 111 being greater than the gain of the peaking amplifier 117. Further, practical designs of the output matching network 115 that optimize efficiency at the amplifier's envelope average output power frequently result in higher gain of the carrier amplifier stage 101 as compared to the gain of the peaking amplifier stage 103. Thus, the carrier amplifier stage 101 most often produces a larger proportion of the output PEP power than does the peaking amplifier stage 103.

At PEP drive, the two 100 ohm load impedances (one presented to the output of the peaking amplifier stage 103 and the other presented to the output of the combiner 107 through transformation of the 50 ohm impedance presented to the carrier amplifier stage 101) are in parallel and, thus, match the 50 ohm amplifier load impedance 130. As is well known, optimal power transfer occurs when an amplifier's output impedance is matched to (i.e., a complex conjugate of) the amplifier's load impedance. Further, with the Doherty configuration, both amplifier stages 101, 103 maintain operation near saturation with corresponding high efficiency when the input signal 128 is at the PEP drive level 203. Thus, as described above, the Doherty-type amplifier 100 employs a level sensitive load impedance modulation technique to maintain saturated amplifier stage operation over a six dB peak-to-average ratio of output powers.

Although the Doherty-type amplifier 100 has many advantages, it also has some disadvantages, especially when such an amplifier 100 is evaluated for use in portable wireless applications, such as portable radios and radiotelephones. The marketplace is forcing portable wireless devices to be physically smaller and more efficient to increase talk-time available from low power battery sources. However, the typical Doherty-type amplifier 100 does not lend itself easily to small size implementation. In particular, the transmission lines 123, 124 required for the signal splitter 105 and the phase-matching transmission line 109 can be quite lengthy (e.g., 2.2 inches on a printed circuit board having a dielectric constant of 4.0 when the operating frequency is 800 Megahertz (MHz)). In addition, the use of a 3 dB signal splitter 105 wastes one-half of the input signal power when the input signal amplitude is at or below the envelope average 201 because the peaking amplifier 117 is cutoff and equal input power is provided to each amplifier stage 101, 103 at all times. This waste in power results in lower effective amplifier gain and, as a result, lower efficiency for a multi-stage amplifier lineup (not shown) that includes the Doherty-type amplifier 100 as a final amplifier stage of such lineup, even though the Doherty-type design maintains operation of the amplifiers 111, 117 themselves in high efficiency modes.

Therefore, a need exists for an amplifier that provides the advantages of the Doherty-type amplifier 100, while improving amplifier gain—and as a result amplifier lineup efficiency—and being small in physical size to facilitate use in portable wireless devices.

BRIEF DESCRIPTION OF THE DRAWINGS

FIG. 4 illustrates a block diagram of an amplifier in accordance with a preferred embodiment of the present invention.

FIG. 5 illustrates a block diagram of a linear transmitter that includes the amplifier of FIG. 4.

DESCRIPTION OF A PREFERRED EMBODIMENT

Generally, the present invention encompasses an apparatus and method for amplifying an amplitude-varying signal. An amplifier comprises two amplifier stages, a signal splitter, and a signal combiner. The signal splitter receives a signal of varying amplitude and splits the received signal into a first amplitude-varying signal and a second amplitude-varying signal. The first, or carrier, amplifier stage applies a first gain to the first amplitude-varying signal. The second, or peaking, amplifier stage applies a second gain that is greater than the first gain to the second amplitude-varying signal only when an amplitude of the second amplitude-varying signal exceeds a threshold. The signal combiner combines the amplified signals outputted from the amplifier stages to produce the amplifier output signal. By amplifying an amplitude-varying signal in this manner, the present invention permits linear amplifier operation over a six decibel (dB) amplifier output power peak-to-average ratio, while improving amplifier gain and reducing amplifier size, as compared to typical Doherty-type amplifiers, to facilitate use in portable wireless devices.

Figure 3:
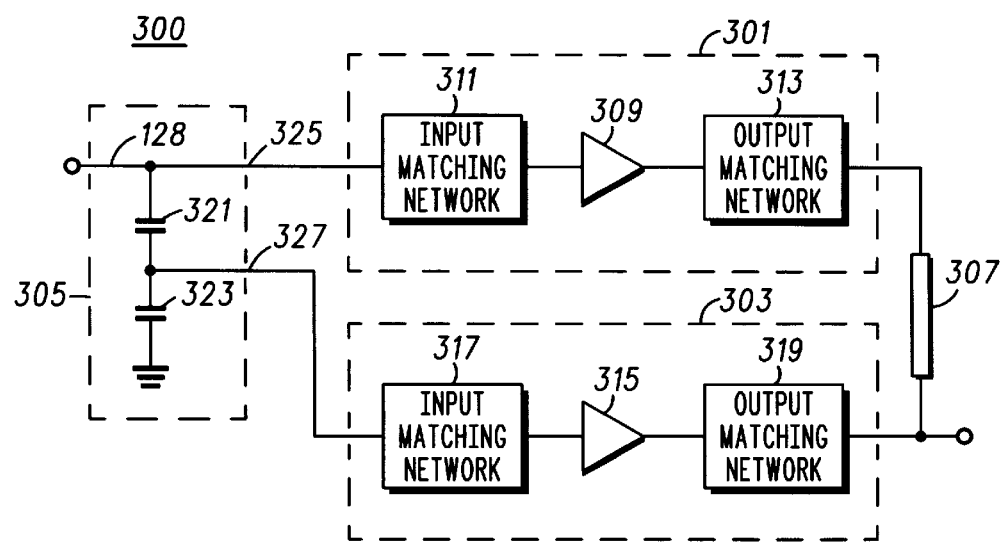
FIG. 3 illustrates a block diagram of an amplifier in accordance with the present invention.

The present invention can be more fully understood with reference to FIGS. 3–7. FIG. 3 illustrates an amplifier 300 in accordance with the present invention. The amplifier 300 includes a carrier amplifier stage 301, a peaking amplifier stage 303, a signal splitter 305, and a signal combiner 307. The carrier amplifier stage 301 preferably comprises a class AB carrier amplifier 309 and associated input and output matching networks 311, 313. The peaking amplifier stage 303 preferably comprises a class C peaking amplifier 315 and associated input and output matching networks 317, 319. However, in an alternate embodiment, the peaking amplifier stage 303 might comprise a class B peaking amplifier 315 instead of a class C peaking amplifier. In a preferred embodiment, the peaking amplifier stage 303 comprises a plurality of serially connected amplifier stages. A preferred embodiment wherein the peaking amplifier stage 303 comprises two serially connected amplifier stages is described below with regard to FIG. 4.

The signal splitter 305 preferably comprises a capacitive divider network consisting of a first capacitance 321 connected between an input to the carrier amplifier stage 101 and an intermediate node and a second capacitance 323 connected between the intermediate node and ground. The capacitances 321, 323 are selected to provide less than 1 dB of loss to the input signal 128 applied to the carrier amplifier stage 301 and approximately 10 dB of loss to the input signal 128 applied to the carrier amplifier stage 301, as compared to 3 dB of loss to both amplifier stages 101, 103 in the signal splitter 105 of the typical Doherty-type amplifier 100. In an alternative embodiment, the capacitances 321, 323 might be distributed or consist of multiple series or parallel-connected capacitances, and be selected to obtain any desired input signal attenuations. In yet another embodiment, the signal splitter 305 might comprise an inductive divider or other known signal splitting techniques that introduce less than 3 dB of loss between the signal splitter input and the input to the carrier amplifier stage 301.

The signal combiner 307 preferably comprises a transmission line transformer having an electrical length of 90 degrees (one-quarter wavelength) at an operating frequency of the amplifier 300 and a nominal characteristic impedance of 70.7 ohms. The input and output matching networks 311, 313, 317, 319 of the amplifier stages 301, 303 are designed using known techniques, such that the combined electrical length of the carrier amplifier stage 101 and the signal combiner 307 is substantially equal to (e.g., within 20 degrees of) an electrical length of the peaking amplifier stage 303. This design approach eliminates the need for the one-quarter wavelength phase-matching transmission line 109 employed by the typical Doherty-type amplifier 100.

Figure 1:
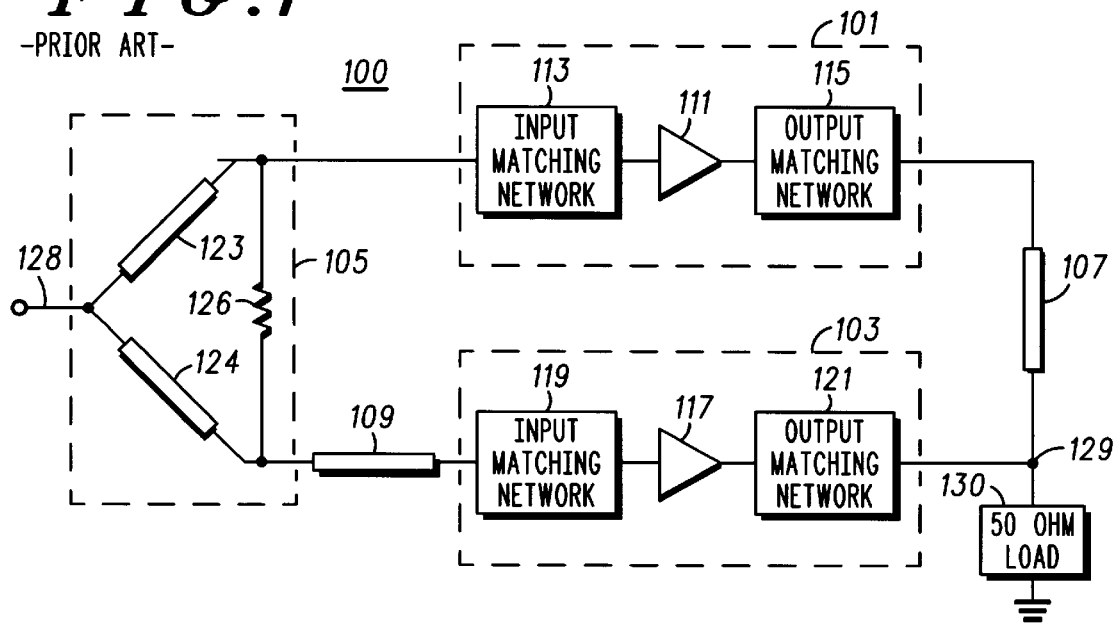
FIG. 1 illustrates a block diagram depiction of a typical Doherty-type linear amplifier.
Figure 2:
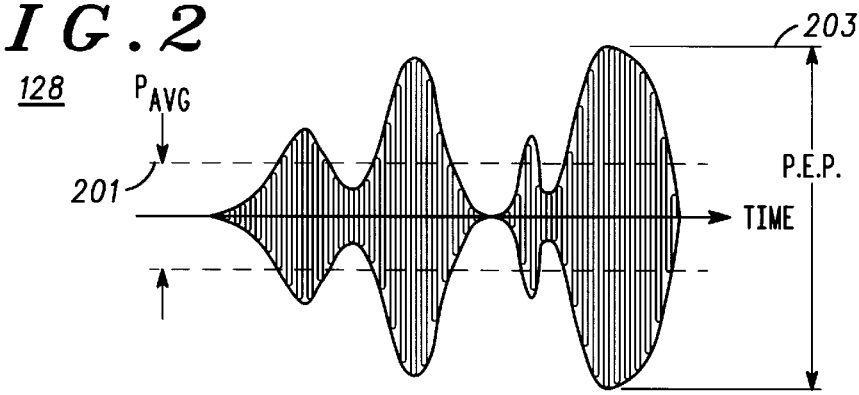
FIG. 2 illustrates an exemplary amplitude-varying input signal.

Operation of the amplifier 300 occurs similar to operation of the Doherty-type amplifier 100 described above with regard to FIG. 1, except that instead of the carrier amplifier stage 101 providing gain that is greater than or equal to the gain provided by the peaking amplifier stage 103, the peaking amplifier stage 303 provides greater gain than the carrier amplifier stage 301. An amplitude varying input signal 128, such as an AM signal or an FM signal having multiple input powers corresponding to multiple power output modes of amplifier operation, is applied to the signal splitter 305. The signal splitter 305 splits the input signal in such a manner as to introduce less than 1 dB of attenuation between the splitter input and the carrier amplifier stage input matching network 311 and approximately 10 dB of attenuation between the splitter input and the peaking amplifier stage input matching network 317. When the input signal 327 to the peaking amplifier stage 303 has an amplitude that is less than or equal to a threshold (i.e., an amplitude that is just insufficient to turn-on the peaking amplifier 315), the carrier amplifier stage 301 applies a gain to its input signal 325 as described above with regard to FIG. 1.

However, when the input signal 327 to the peaking amplifier stage 303 has an amplitude that is greater than or exceeds the threshold (i.e., an amplitude that is sufficient to turn-on the peaking amplifier 315), the peaking amplifier stage 303 applies a gain to its input signal 327 that is greater than the gain applied by the carrier amplifier stage 301 to its input signal 325. The gain applied by the peaking amplifier stage 303 is greater than the gain applied by the carrier amplifier stage 301 to at least offset the additional attenuation applied by the signal splitter 305 to the input signal 128 to produce the peaking amplifier stage's input signal 327. Due to the phase matching designs of the matching networks 311, 313, 317, 319, the amplified signals produced by the amplifier stages 301, 303 combine constructively at the junction of the signal combiner 307 and the output of the peaking amplifier stage 303 to produce the amplifier output signal.

Thus, as described above, the present invention provides an amplifier that performs similar to a Doherty-type amplifier, but without the need for the lengthy transmission lines 109, 123, 124 associated with typical Doherty-type amplifiers. Moreover, the amplifier topology of the present invention, when used as a final amplifier in a cascaded amplifier lineup, provides an improvement in overall amplifier lineup efficiency over using the typical Doherty-type amplifier as the final amplifier. Amplifier efficiency of a cascaded amplifier lineup consisting of two amplifiers is described by the following equation:

$$\eta_{lineup} = [(1/\eta_{final}) + (1/(G_{final} * \eta_{driver}))]^{-1},$$

where $\eta_{lineup}$ is the efficiency of the amplifier lineup, $\eta_{final}$ is the efficiency of the final amplifier (e.g., amplifier 300), $\eta_{driver}$ is the efficiency of the driver amplifier (i.e., the amplifier providing the input signal 128 (not shown)), and $G_{final}$ is the gain of the final amplifier. Assuming that a Doherty-type final amplifier 100 and a final amplifier 300 in accordance with the present invention have approximately equal efficiencies, the amplifier lineup that includes final amplifier 300 has a higher efficiency than an amplifier lineup that includes a Doherty-type final amplifier 100 because the gain ($G_{final}$) of the final amplifier 300 is greater than the gain of the Doherty-type final amplifier 100. As evidenced from the above equation, an increase in $G_{final}$ produces an increase in lineup efficiency. The improvement in gain results from the reduction in loss introduced by the signal splitter 305 in the carrier amplifier path of the present invention as compared to the loss introduced by the signal splitter 105 of the Doherty-type amplifier 100. The present invention permits a reduction in the splitter loss by increasing the gain of the peaking amplifier stage 303 to a value that is greater than the gain of the carrier amplifier stage 301. Furthermore, introducing the additional gain in the peaking path, instead of in the carrier path, results in lower average direct current power dissipation for the amplifier 300 because the peaking path is active only when the input signal 327 has an amplitude that exceeds the threshold.

FIG. 4 illustrates an amplifier 400 in accordance with a preferred embodiment of the present invention. The preferred amplifier 400 includes the carrier amplifier stage 301, a first peaking amplifier stage 403, a second peaking amplifier stage 405, the signal splitter 305, and the signal combiner 307. The peaking amplifier stages 403, 405 include respective input and output matching networks 419, 421, 425, 427 and the first peaking amplifier stage 403 includes an optional phase-matching transmission line 420. The peaking amplifier stages 403, 405 are serially connected and the output matching network 421 of the first peaking amplifier stage 403 and the input matching network 425 of the second peaking amplifier stage 405 are combined to form a single interstage matching network 429. The amplifier 309 of the carrier amplifier stage 301 preferably comprises a class AB gallium arsenide transistor having a gain of approximately 12 dB. The amplifier 423 of the second peaking amplifier stage 405 preferably comprises a class C gallium arsenide transistor having a gain of approximately 11 dB. The amplifier 417 of the first peaking amplifier stage 403 preferably comprises a class B gallium arsenide transistor having a gain of approximately 12 dB. Accordingly, the peaking amplifier branch of the amplifier 400 applies more gain (e.g., 23 dB) than does the carrier amplifier branch (e.g., 12 dB). As discussed above, this additional gain in the peaking amplifier branch results in improved overall amplifier lineup efficiency. In addition, the first peaking amplifier stage 403 provides desired isolation between the carrier amplifier 309 and the second peaking amplifier 423 to assure linear performance of the preferred amplifier 400, thereby eliminating the need for isolation in the signal splitter 305.

The preferred amplifier 400 is fabricated as a combination of a monolithic microwave integrated circuit (MMIC), a multiple layer ceramic (MLC) structure, distributed circuit elements, and discrete circuit elements. The input and output matching networks 419, 421, 425, 427 comprise a combination of distributed and discrete circuit elements. In the preferred embodiment, the amplifiers 309, 417, 423 and distributed portions of the interstage matching network 429 and input matching networks 311 and 419 are elements of the MMIC. Distributed portions of the output matching networks 313, 427 and the signal combiner 307 are elements of the MLC structure. The remaining elements, such as signal splitter 305, the phase-matching transmission line 420, if included, and remaining elements of the matching networks 311, 313, 419, 427, 429 are discrete or distributed elements positioned in appropriate locations adjacent to or between the MMIC and the MLC structure.

Operation of the amplifier 400 occurs in a manner that is substantially similar to operation of the amplifier 300 described above with regard to FIG. 3. The input signal 128 is split by signal splitter 305 according to the ratio of capacitances 321, 323. In the preferred embodiment, the capacitances are selected to provide 0.33 dB of loss in the carrier amplifier stage's path and 11.3 dB of loss in the peaking amplifier stage's path. When the amplitude of the splitter output signal 435 applied to the first peaking amplifier stage 403 is less than or equal to a threshold, the first peaking amplifier stage 403 and the second peaking amplifier stage 405 remain in an "off" state, thus only the carrier amplifier stage 301 is operational to amplify its input signal 431. When the amplitude of the splitter output signal 435 applied to the first peaking amplifier stage 403 exceeds the threshold, the first peaking amplifier stage 403 turns "on" and applies a gain to the input signal 435. The first peaking amplifier stage 403 provides the amplified signal to the second peaking amplifier stage 405. The second peaking amplifier stage 405 amplifies its input signal and provides an amplified signal for combination with the amplified signal produced by the carrier amplifier stage 301.

The amplified signal produced by the second peaking amplifier stage 405 adds constructively with the amplified signal produced by the carrier amplifier stage 301 because the combined electrical length of the carrier amplifier stage 301 and the signal combiner 307 at an operating frequency of the amplifier 400 is substantially equal to (e.g., within 20 degrees of) a combined electrical length of the first peaking amplifier stage 403 and the second peaking amplifier stage 405, including its optional phase-matching transmission line 420. Ideally, the phase-matching transmission line 420 is excluded from the second peaking amplifier stage 405. However, depending on the design of the peaking amplifier stages 403, 405 and the forward transfer phases of the peaking amplifiers 417, 423, the phase-matching transmission line 420 may be necessary. When used, the preferable electrical length of the phase-matching transmission line 420 is substantially less than (e.g., less than one-half) the electrical length of the signal combiner 307. In the preferred embodiment, the electrical length of the carrier amplifier stage 301 is substantially equal to the electrical length of the second peaking amplifier stage 405 and the electrical length of the first peaking amplifier stage 403 is substantially equal to the electrical length of the signal combiner 307.

FIG. 5 illustrates a linear transmitter 500 that includes the amplifier of FIG. 4. The linear transmitter 500 includes a signal source 501, a summer 507, a forward gain path 503, and a negative feedback path 505. The signal source 501 preferably comprises a quadrature amplitude modulator. The summer 507 preferably comprises a signal combining junction. The forward gain path 503 preferably comprises upconverter mixers (not shown), a driver amplifier 509, and a final amplifier, such as the amplifier 400 described above with regard to FIG. 4. In an alternate embodiment, the final amplifier might comprise the amplifier 300 discussed above with regard to FIG. 3. The negative feedback path 505 preferably comprises known couplers, amplifiers, down converter mixers, loop phase adjustment circuits, and loop gain adjustment circuits used in Cartesian feedback amplifier systems to mitigate adjacent channel interference (i.e., signals produced at frequencies adjacent to the current operating frequency of the transmitter) during operation of the transmitter 500.

General operation of a linear transmitter employing Cartesian feedback is well-known; thus no further discussion will be presented. Such a linear transmitter 500 is preferably used as the transmitter element of a radio communication device, such as a base station, a mobile two-way radio, a portable two-way radio, a radiotelephone, or a wireless computer modem card, in digital communication systems that are susceptible to adjacent channel interference, such as cellular communication systems or cellular-type land mobile communication systems. By using a Cartesian feedback linear transmitter, such as linear transmitter 500, transmitter operation remains substantially linear, notwithstanding the time-varying output powers associated with amplifying amplitude-varying input signals produced by the signal source 501.

Figure 6:
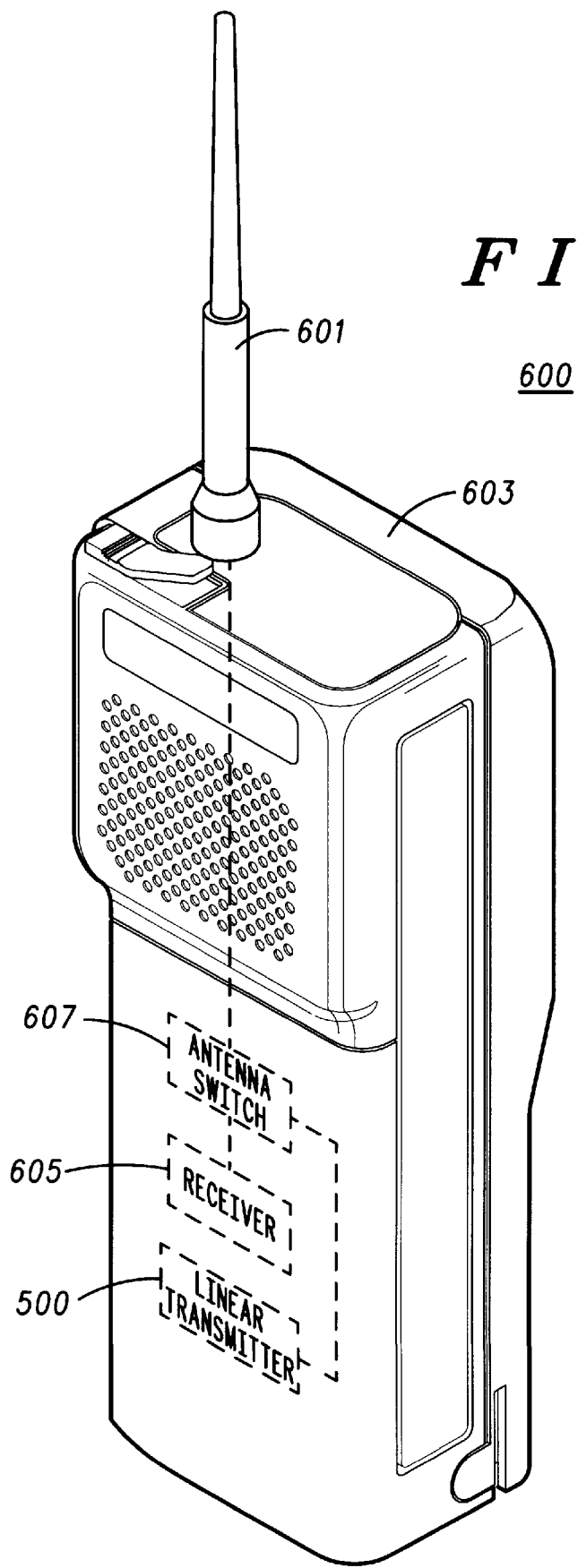
FIG. 6 illustrates a block diagram of an exemplary radio communication unit that includes the linear transmitter of FIG. 5.

FIG. 6 illustrates an exemplary radio communication unit 600 that includes the linear transmitter 500 of FIG. 5. The radio communication unit 600 includes an antenna 601 and a housing 603 that contains an antenna switch 607, a receiver 605, and the linear transmitter 500. The radio communication unit 600 depicted in FIG. 6 is a half-duplex two-way communication device. In an alternate embodiment, the radio communication unit might comprise a full-duplex two-way communication device (such as a radiotelephone), in which case the antenna switch 607 would be replaced with a duplexer (not shown). As shown, the receiver 605 and the linear transmitter 500 are coupled to the antenna 601 via the antenna switch 607. General operation of the radio communication unit 600 is well-known, accordingly no further discussion will be presented.

Figure 7:
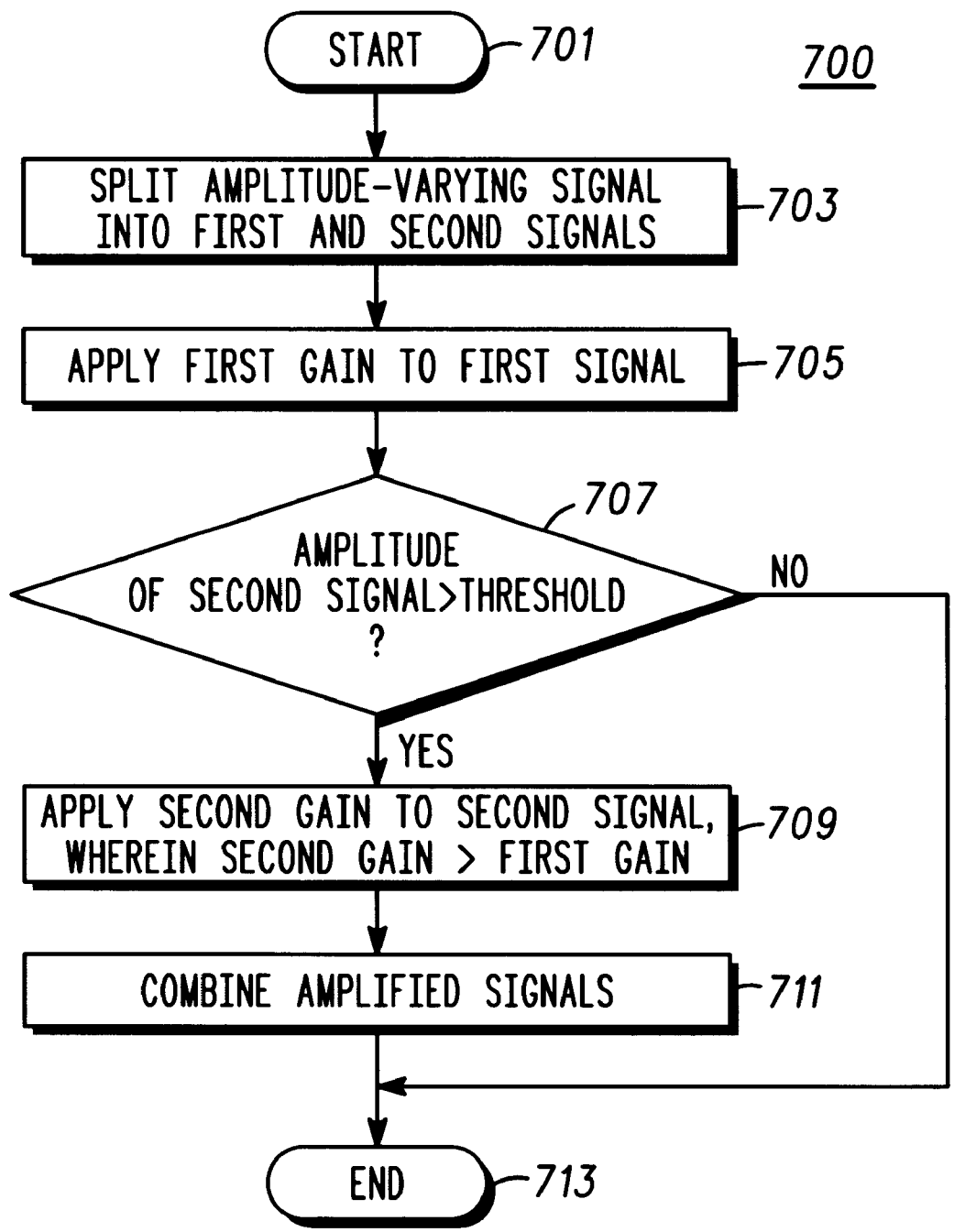
FIG. 7 illustrates a logic flow diagram of steps executed by an amplifier to amplify an amplitude-varying signal in accordance with a preferred embodiment of the present invention.

FIG. 7 illustrates a logic flow diagram 700 of steps executed by an amplifier to amplify an amplitude-varying signal in accordance with a preferred embodiment of the present invention. The logic flow begins (701) when the amplifier splits (703) the amplitude-varying signal into first and second amplitude-varying signals. In the preferred embodiment, the amplifier capacitively divides the amplitude-varying signal unequally to produce the first amplitude-varying signal and the second amplitude-varying signal, such that the first amplitude-varying signal has an amplitude that is greater than the second amplitude-varying signal. The amplifier then applies (705) a first gain to the first amplitude-varying signal to produce a first amplified signal and determines (707) whether a current amplitude of the second amplitude-varying signal exceeds a threshold amplitude (e.g., an amplitude that results in the amplifier producing a desired average output power).

When the present amplitude of the second amplitude-varying signal is less than or equal to the threshold, the amplifier provides the first amplified signal as the amplifier output signal and the logic flow ends (713). However, when the present amplitude of the second amplitude-varying signal exceeds the threshold, the amplifier applies (709) a second gain to the second amplitude-varying signal to produce a second amplified signal, wherein the second gain is greater than the first gain. In the preferred embodiment, the second gain is 11 dB greater than the first gain. The amplifier than combines (711) the two amplified signals to produce the amplifier output signal and the logic flow ends (713).

The present invention encompasses an apparatus and method for amplifying an amplitude-varying signal. With this invention, a linear amplifier that performs substantially similar to a Doherty-type amplifier can be fabricated using MMIC and MLC technologies for use in portable communication devices. By eliminating the lengthy splitter and phase-matching transmission lines used in the typical Doherty-type amplifier, the present invention substantially reduces the size and costs associated with fabricating such transmission lines in a compact size, even though the present invention includes an additional active device as compared to the Doherty-type amplifier. The cost reduction occurs because the cost of producing the Doherty splitter and phase-matching transmission line in an MLC structure (e.g., about $3.00) is substantially more than the cost of the additional active device and its associated matching circuitry (e.g., about $1.00). Furthermore, the present invention improves the efficiency of the overall amplifier lineup (i.e., driver and final amplifiers) by increasing the effective gain of the final amplifier when the final amplifier comprises an amplifier in accordance with the present invention as opposed to when the final amplifier comprises a Doherty-type amplifier.

While the present invention has been particularly shown and described with reference to particular embodiments thereof, it will be understood by those skilled in the art that various changes in form and details may be made therein without departing from the spirit and scope of the present invention.

I claim:

1. A Doherty-type amplifier comprising:

a signal splitter having an input that receives a signal of varying amplitude and producing a first amplitude-varying signal and a second amplitude-varying signal;

a carrier amplifier stage, coupled to a first output of the signal splitter, applying a first gain to the first amplitude-varying signal to produce a first amplified signal;

a peaking amplifier stage, coupled to a second output of the signal splitter, applying a second gain to the second amplitude-varying signal to produce a second amplified signal only when an amplitude of the second amplitude-varying signal exceeds a threshold, the second gain being greater than the first gain and reciprocally related to a ratio of a power of the send amplitude-varying signal to a power of the first amplitude-varying signal; and a signal combiner, coupled to an output of the carrier amplifier stage and an output of the peaking amplifier stage, combining the first amplified signal and the second amplified signal.

2. The amplifier of claim 1, wherein the carrier amplifier stage comprises a class AB amplifier stage.

3. The amplifier of claim 1, wherein the peaking amplifier stage comprises a class C amplifier stage.

4. The amplifier of claim 1, wherein the peaking amplifier stage comprises a class B amplifier stage.

5. The amplifier of claim 1, wherein the peaking amplifier stage comprises a plurality of serially connected amplifier stages.

6. The amplifier of claim 5, wherein a first of the plurality of serially connected amplifier stages comprises a class B amplifier stage and wherein a second of the plurality of serially connected amplifier stages comprises a class C amplifier stage.

7. The amplifier of claim 1, wherein the signal splitter comprises a capacitive divider network.

8. The amplifier of claim 1, wherein the signal combiner comprises a transmission line having an electrical length of 90 degrees at an operating frequency of the amplifier.

9. The amplifier of claim 1, wherein the signal of varying amplitude comprises an amplitude modulated signal.

10. The amplifier of claim 1, wherein a combined electrical length of the signal combiner and the carrier amplifier stage is substantially equal to an electrical length of the peaking amplifier stage.

11. The amplifier of claim 1, wherein at least a portion of the carrier amplifier stage and at least a portion of the peaking amplifier stage comprise elements of a monolithic microwave integrated circuit.

12. The amplifier of claim 1, wherein the carrier amplifier stage includes a first output matching network and the peaking amplifier stage includes a second output matching network and wherein at least a portion of the first output matching network and at least a portion of the second output matching network are distributed elements.

13. The amplifier of claim 12, wherein at least some of the distributed elements are embodied in a multiple layer ceramic structure.

14. The amplifier of claim 13, wherein the signal combiner comprises an element of the multiple layer ceramic structure.

15. The amplifier of claim 1, wherein the carrier amplifier stage includes a first output matching network and the peaking amplifier stage includes a second output matching network and wherein at least a portion of the first output matching network and at least a portion of the second output matching network are discrete elements.

16. A Doherty-type amplifier comprising:

a signal splitter having an input that receives a signal of varying amplitude and producing a first amplitude-varying signal and a second amplitude-varying signal;

a carrier amplifier stage, coupled to a first output of the signal splitter, applying a first gain to the first amplitude-varying signal to produce a first amplified signal;

a first peaking amplifier stage having an input coupled to a second output of the signal splitter and applying a second gain to the second amplitude-varying signal to produce a second amplified signal only when an amplitude of the second amplitude-varying signal exceeds a threshold;

a second peaking amplifier stage having an input coupled to an output of the first peaking amplifier stage and applying a third gain to the second amplified signal to produce a third amplified signal, wherein the third gain is less than or equal to the first gain, wherein a sum of the second gain and the third gain is greater than the first gain, and wherein the second peaking amplifier stage is of a different operating class than the first peaking amplifier stage; and a signal combiner, coupled to an output of the first amplifier stage and an output of the third amplifier stage, combining the first amplified signal and the third amplified signal.

17. The amplifier of claim 16, wherein the signal combiner comprises a transmission line having a predetermined electrical length at an operating frequency of the amplifier.

18. The amplifier of claim 17, wherein an electrical length of the first peaking amplifier stage at the operating frequency of the amplifier is substantially equal to the predetermined electrical length of the signal combiner.

19. The amplifier of claim 17, wherein the first peaking amplifier stage includes a transmission line having an electrical length at the operating frequency of the amplifier that is substantially less than the predetermined electrical length of the signal combiner.

20. The amplifier of claim 16, wherein the signal splitter comprises a capacitive divider network.

21. The amplifier of claim 16, wherein the signal splitter provides less than one decibel of signal loss between the input of the signal splitter and the first output of the signal splitter.

22. The amplifier of claim 16, wherein a combined electrical length of the signal combiner and the carrier amplifier stage is substantially equal to a combined electrical length of the first peaking amplifier stage and the second peaking amplifier stage.

23. A method for amplifying an amplitude-varying signal in a Doherty-type amplifier, the method comprising the steps of:

splitting the amplitude-varying signal into a first signal and a second signal;

applying a first gain to the first signal in a carrier amplifier stage of the Doherty-type amplifier to produce a first amplified signal;

applying a second gain to the second signal in a peaking amplifier stage only when an amplitude of the second signal exceeds a threshold to produce a second amplified signal, wherein the second gain is greater than the first gain and reciprocally related to a ratio of a power of the second signal to a power of the first signal; and combining the first amplified signal and the second amplified signal to produce an output signal.

24. The method of claim 23, wherein the step of splitting the amplitude-varying signal comprises the step of splitting the amplitude-varying signal unequally, such that an amplitude of the first signal is greater than an amplitude of the second signal.

25. The method of claim 23, wherein the step of splitting the amplitude-varying signal comprises the step of capacitively dividing the amplitude-varying signal.

26. The method of claim 23, wherein the step of applying the second gain comprises the steps of:

applying a third gain to the second signal to produce a third amplified signal; and applying a fourth gain to the third amplified signal, wherein the fourth gain is less than or equal to the first gain and wherein a sum of the third gain and the fourth gain constitutes the second gain.

* * * * *

UNITED STATES PATENT AND TRADEMARK OFFICE
CERTIFICATE OF CORRECTION

| | |
|---|---|
| PATENT NO. : 6,085,074 | Page 1 of 1 |
| DATED : July 4, 2000 | |
| INVENTOR(S) : Cygan, Lawrence F. | |

It is certified that error appears in the above-identified patent and that said Letters Patent is hereby corrected as shown below:

<u>Column 8,</u>
Line 63 reads "send" should be -- second --.

Signed and Sealed this

Seventh Day of August, 2001

*Attest:*

*Attesting Officer*

NICHOLAS P. GODICI
*Acting Director of the United States Patent and Trademark Office*